United States Patent
Oohasi et al.

(10) Patent No.: US 7,742,885 B2
(45) Date of Patent: Jun. 22, 2010

(54) VEHICLE POWER SUPPLY DEVICE AND ITS DEGRADATION JUDGMENT METHOD

(75) Inventors: Tosihiko Oohasi, Osaka (JP); Yohsuke Mitani, Osaka (JP); Junji Takemoto, Hyogo (JP); Kazuki Morita, Osaka (JP); Yoshimitu Odajima, Osaka (JP)

(73) Assignee: Panasonic Corporation, Osaka (JP)

(*) Notice: Subject to any disclaimer, the term of this patent is extended or adjusted under 35 U.S.C. 154(b) by 271 days.

(21) Appl. No.: 11/913,128

(22) PCT Filed: Jul. 21, 2006

(86) PCT No.: PCT/JP2006/314449
§ 371 (c)(1), (2), (4) Date: Oct. 30, 2007

(87) PCT Pub. No.: WO2007/013362
PCT Pub. Date: Feb. 1, 2007

(65) Prior Publication Data
US 2009/0088993 A1    Apr. 2, 2009

(30) Foreign Application Priority Data
Jul. 26, 2005   (JP) .............................. 2005-215353

(51) Int. Cl.
G01R 31/36   (2006.01)
G01R 15/00   (2006.01)
H02J 7/04    (2006.01)

(52) U.S. Cl. ............................ 702/63; 702/57; 320/137; 320/166; 320/150; 324/430

(58) Field of Classification Search ................. 702/57, 702/63; 320/150, 137; 324/430, 765
See application file for complete search history.

(56) References Cited

U.S. PATENT DOCUMENTS
2002/0085397 A1 * 7/2002 Suzui et al. .................. 363/37

FOREIGN PATENT DOCUMENTS
JP     2005-028908 A    2/2005

OTHER PUBLICATIONS
International Search Report for Application No. PCT/JP2006/314449 dated Aug. 22, 2006.

* cited by examiner

*Primary Examiner*—Carol S Tsai
*Assistant Examiner*—Janet L Suglo
(74) *Attorney, Agent, or Firm*—RatnerPrestia

(57) ABSTRACT

A vehicle power supply device has a capacitor unit including capacitors storing auxiliary power; a temperature sensor; a charge circuit; a capacitor-unit current detector; a capacitor-unit voltage detector; a controller; a storage; and a determination unit. The determination unit determines the degradation level of the capacitor unit based on at least one of an internal resistance standard value and a corrected calculated value of capacitance. This structure determines degradation of the vehicle power supply device more accurately than ever, so that the device can be used until the end of the actual life.

11 Claims, 10 Drawing Sheets

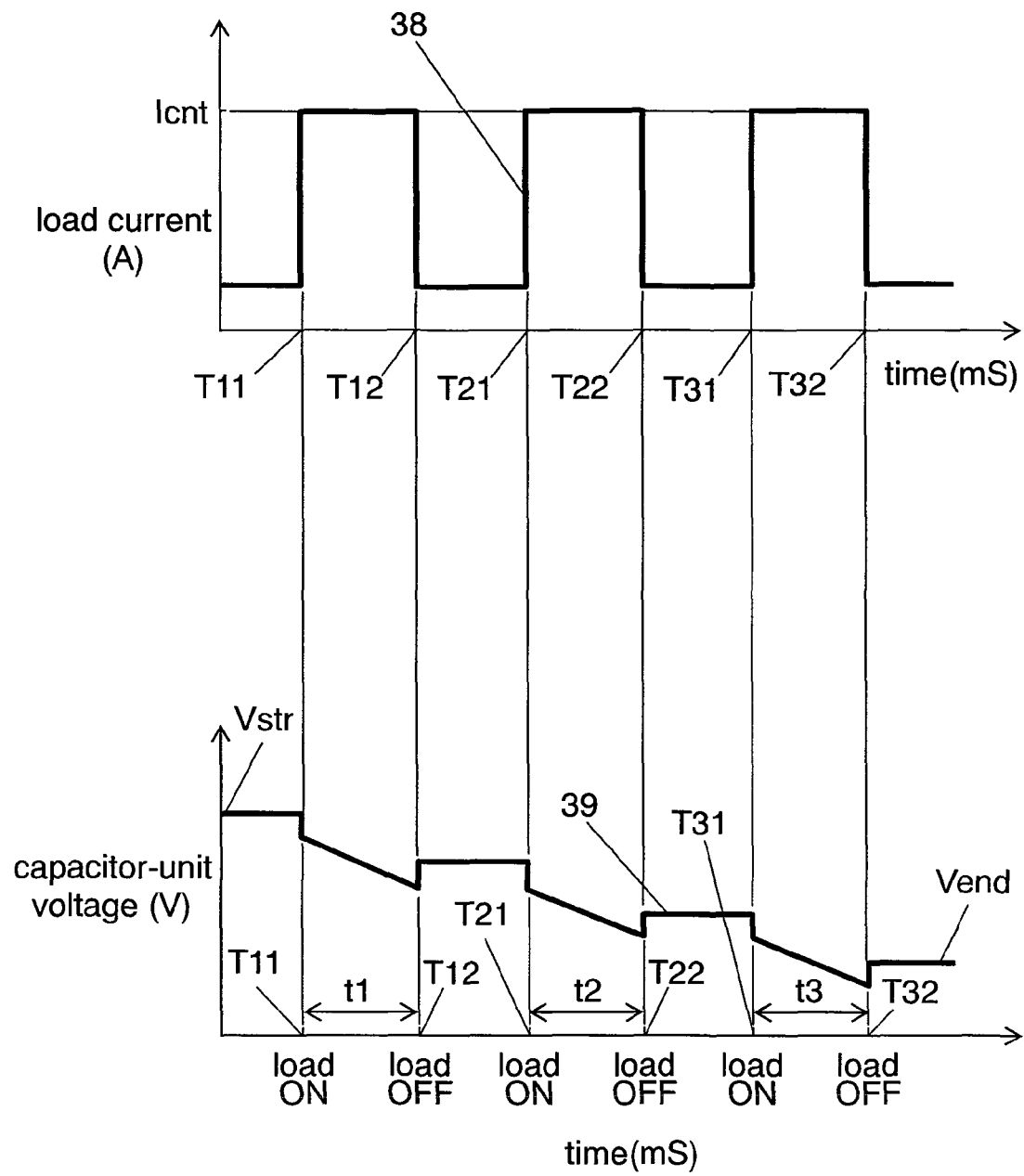

VEHICLE POWER SUPPLY DEVICE AND ITS DEGRADATION JUDGMENT METHOD

This application is a U.S. National Phase Application of PCT International Application PCT/JP2006/314449.

TECHNICAL FIELD

The present invention relates to emergency power supplies for electronic devices using battery or the like. More particularly, the present invention relates to a vehicle power supply device that is used, for example, in an electronic brake system for electrically braking a vehicle, and to a method for determining degradation of the device.

BACKGROUND ART

In recent years, hybrid vehicles and electric vehicles have been rapidly developed. In line with this, various suggestions have been made to change the braking system of vehicles from the conventional mechanical hydraulic control to electrohydraulic control.

A battery is generally used as a power supply for controlling vehicles electrohydraulically. However, if the power supply from the battery is cut off for some reason, it may be impossible to hydraulically control and hence to brake the vehicles.

To prepare for such an emergency, various vehicle power supply devices have been proposed which include high-capacity capacitors or the like as an auxiliary power supply besides a battery.

Vehicle power supply devices, which involve the vehicle braking in an emergency, are essential to supplying electric power surely in an emergency. Therefore, it is required to ensure the accurate determination of degradation of capacitors, which are key devices for the vehicle power supply devices.

A conventional vehicle power supply device determines degradation of the power supply as follows. First, the vehicle power supply device determines the internal resistance value and the capacitance value of the capacitor unit including a plurality of capacitors. The device then makes a temperature sensor provided near the capacitor unit detect the temperature in the vicinity of the capacitor unit. The device then corrects the internal resistance value and the capacitance value based on the detected temperature. The device compares these corrected values with the degradation standard value data corresponding to the detected temperature.

When sufficient electricity is supplied to the load, the internal resistance value of the capacitor unit is correlated with the inverse of the capacitance value. However, the correlation changes when the capacitor unit is degraded.

The characteristic that the correlation changes in this manner is taken advantage to determine the degradation of the vehicle power supply device. More specifically, the relation between the internal resistance value and the capacitance value, after the capacitor unit is degraded, is previously stored with respect to each temperature in a ROM (Read only memory) connected to a controller (microcomputer). The vehicle power supply device is determined to be degraded when the internal resistance value corresponding to the capacitance value, which is corrected based on the temperature at a certain point, reaches the stored degradation standard value of the internal resistance value.

An example of the degradation standard value data of the internal resistance value corresponding to the capacitance value is shown in FIG. 10. In FIG. 10, the horizontal axis represents the capacitance value, and the vertical axis represents the internal resistance value. The correlation between the capacitance value and the internal resistance value differs depending on the temperature. The correlation is shown at temperatures at 15° C. intervals between −30° C. and 30° C.

When a capacitor unit has a temperature of 0° C., a capacitance value of 10 F, and an internal resistance value of 130 mΩ, the degradation standard value (limit value) at 0° C. can be obtained in FIG. 10. In short, as shown by the circle plots (0° C.) of FIG. 10, degradation standard value 101 is an internal resistance value of 230 mΩ. Accordingly, the capacitor unit has not reached standard value 101, so that it is determined not to be degraded yet.

When a capacitor unit has a temperature of 15° C., a capacitance value of 11 F, and an internal resistance value of 115 mΩ, the degradation standard value at 15° C. can be also obtained in FIG. 10. In short, as shown by the square plots (15° C.) of FIG. 10, degradation standard value 102 is an internal resistance value of 180 mΩ. Accordingly, the capacitor unit has not reached standard value 102, so that it is also determined not to be degraded yet.

On the other hand, when a capacitor unit has a temperature of 30° C., a capacitance value of 11 F, and an internal resistance value of 110 mΩ, the degradation standard value at 30° C. can be also obtained in FIG. 10. In short, as shown by the "X" plots (30° C.) of FIG. 10, degradation standard value 103 is an internal resistance value of 80 mΩ. Accordingly, the capacitor unit has exceeded standard value 103, so that it is determined to be degraded.

One such conventional vehicle power supply device is disclosed, for example, in Japanese Patent Unexamined Publication No. 2005-28908.

SUMMARY OF THE INVENTION

The present invention provides a vehicle power supply device that can accurately determine degradation of the capacitor unit included therein so as to be used until the end of the actual life of the capacitor unit, and also provides a method for determining degradation of the vehicle power supply device. The vehicle power supply device and the method for determining degradation thereof are achieved by preventing the capacitor unit from being erroneously determined to be degraded and to reach the end of its actual life and hence from being replaced even though it is not degraded and it is actually usable.

The vehicle power supply device of the present invention includes a capacitor unit, a temperature sensor, a charge circuit, a capacitor-unit current detector, a capacitor-unit voltage detector, a controller, a storage, and a determination unit. The capacitor unit includes a plurality of capacitors storing auxiliary power. The temperature sensor detects the temperature of the capacitor unit. The charge circuit charges electric power to the capacitor unit. The capacitor-unit current detector detects the current value of the capacitor unit. The capacitor-unit voltage detector detects the voltage value of the capacitor unit. The controller is electrically connected to the temperature sensor, the charge circuit, the capacitor-unit current detector, and the capacitor-unit voltage detector, and obtains the internal resistance value and the capacitance value of the capacitor unit from the voltage value and the current value. The storage stores a correction calculation formula and a plurality of degradation determination formulas. The correction calculation formula is used to perform the correction calculation of the internal resistance value and the capacitance value in accordance with the temperature. The degradation determination formulas correspond to the numerical ranges of the corrected calculated value of capacitance and are used to calculate the internal resistance standard value from the corrected calculated value of capacitance. The determination unit determines the degradation level of the capacitor unit based on at least one of the internal resistance standard value and the corrected calculated value of capacitance. This structure determines degradation of the vehicle power supply device more accurately than ever so that the device can be used until the end of the actual life.

The method for determining degradation of a vehicle power supply device of the present invention includes a temperature detecting step, an internal-resistance-value-acquiring step, a capacitance-value-acquiring step, a corrected-calculated-value-acquiring step, an internal-resistance-standard-value-acquiring step, and a degradation determination step. The temperature detecting step detects the temperature of a capacitor unit including a plurality of capacitors storing auxiliary power. The internal-resistance-value-acquiring step acquires the internal resistance value of the capacitor unit. The capacitance-value-acquiring step acquires the capacitance value of the capacitor unit. The corrected-calculated-value-acquiring step performs the correction calculation of the internal resistance value and the capacitance value in accordance with the temperature, thereby acquiring a corrected calculated value of internal resistance and a corrected calculated value of capacitance. The internal-resistance-standard-value-acquiring step acquires an internal resistance standard value from the corrected calculated value of capacitance using a plurality of different degradation determination formulas corresponding to the numerical ranges of the corrected calculated value of capacitance. The degradation determination step determines the degradation level of the capacitor unit based on at least one of the internal resistance standard value and the corrected calculated value of capacitance. This method determines degradation of the vehicle power supply device more accurately than ever so that the device can be used until the end of the actual life.

BRIEF DESCRIPTION OF THE DRAWINGS

FIG. 8 is a graph showing the change in the current-voltage characteristics of the capacitor unit with time in the vehicle power supply device of FIG. 1.

DETAILED DESCRIPTION OF PREFERRED EMBODIMENT

An embodiment of the present invention is described as follows with reference to drawings.

Embodiment

Figure 1:
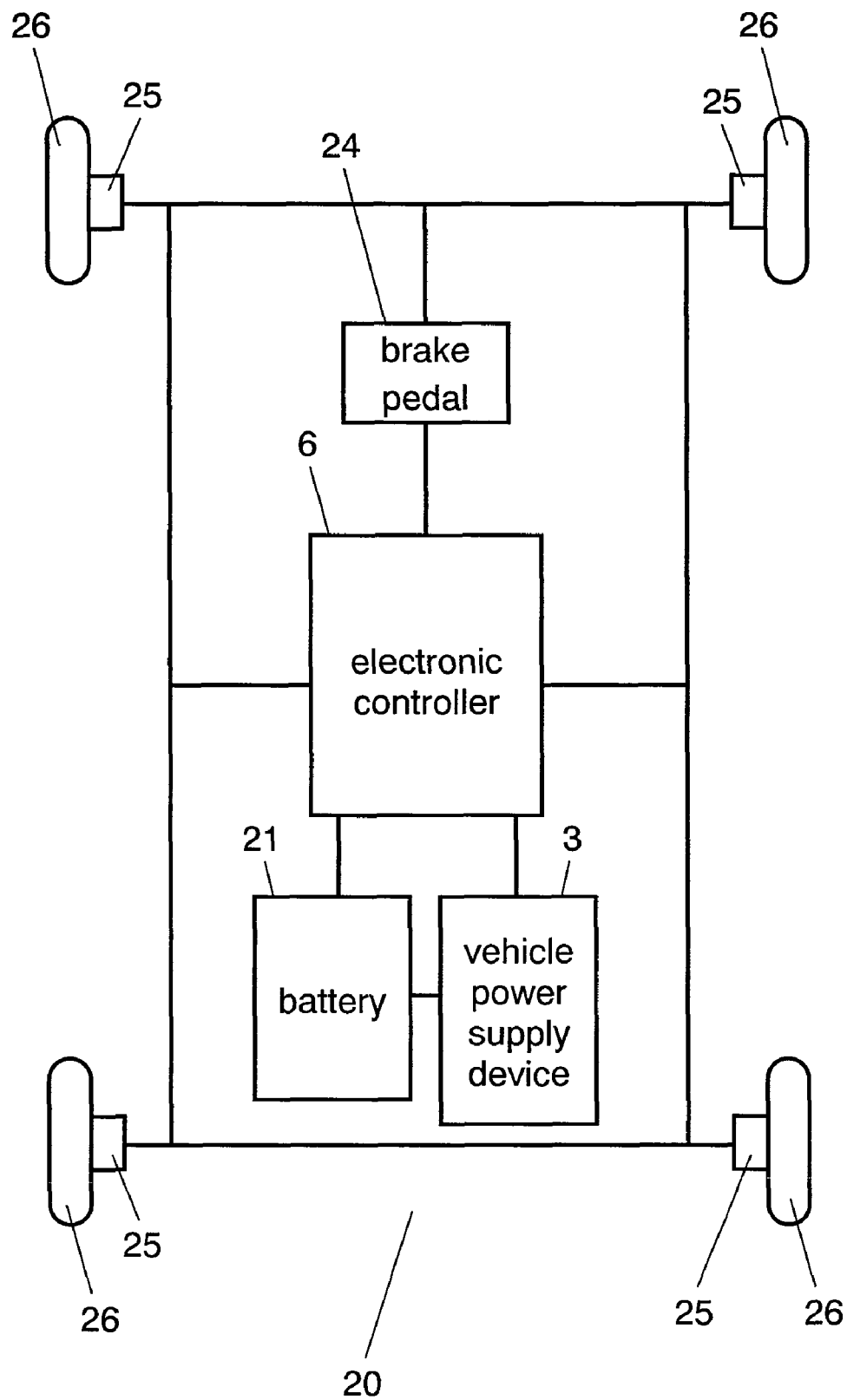
FIG. 1 is a schematic diagram showing a vehicle having a vehicle power supply device according to an embodiment of the present invention.
Figure 2:
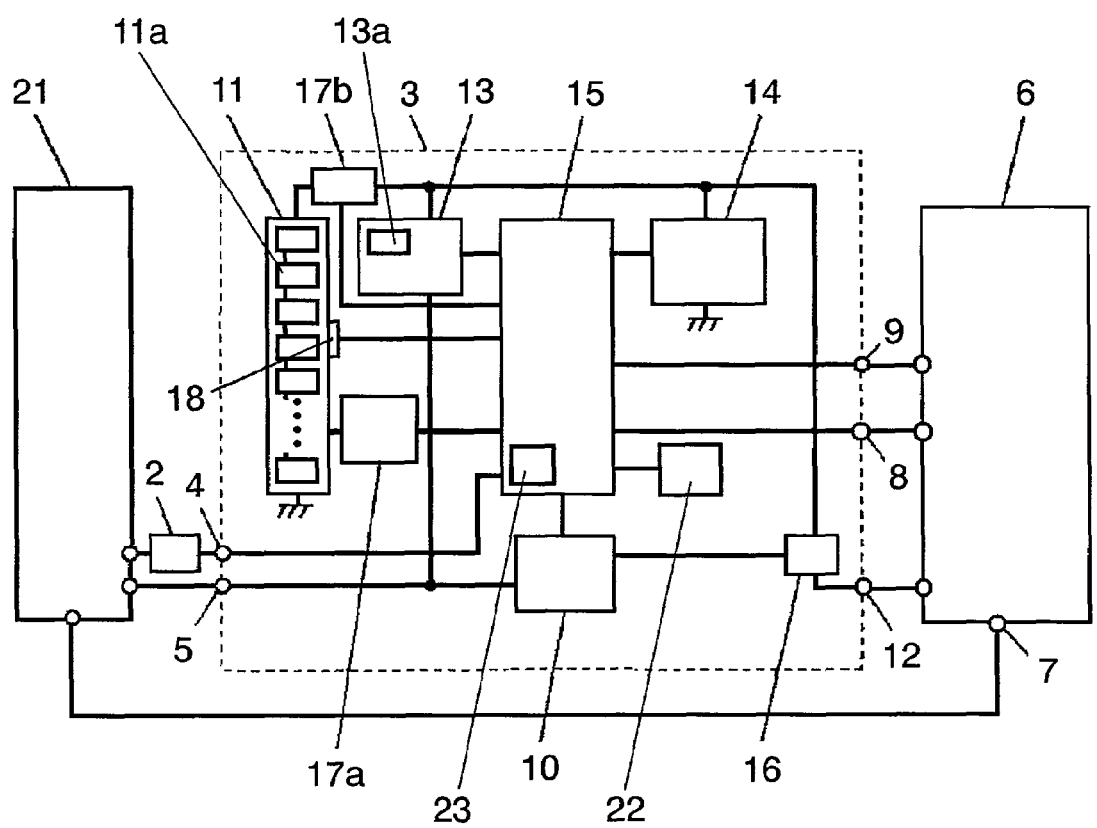
FIG. 2 is a block circuit diagram of the vehicle power supply device of FIG. 1.

FIG. 1 is a schematic diagram showing a vehicle having a vehicle power supply device according to the embodiment of the present invention. FIG. 2 is a block circuit diagram of the vehicle power supply device of the embodiment of the present invention.

In FIG. 1, vehicle 20 includes battery 21 of 12V to supply power thereto, and vehicle power supply device 3 (hereinafter, device 3) as an auxiliary power supply. Vehicle 20 further includes electronic controller 6 which controls the braking of vehicle 20 by outputting information to control the braking of vehicle 20. Battery 21 and device 3 supply electric power to electronic controller 6. Vehicle 20 further includes brake pedal 24 which transmits the information to control the braking of vehicle 20 to electronic controller 6. The information from brake pedal 24 is transmitted to brakes 25 via electronic controller 6 so as to control brakes 25. This enables brakes 25 to brake tires 26.

In FIG. 2, battery 21 is connected to IG (ignition generator) terminal 4 (hereinafter, terminal 4) in device 3 via ignition switch 2 (hereinafter, switch 2). Switch 2 is provided to start or stop the operation of vehicle 20. Battery 21 is further connected to +BC terminal 5 (hereinafter, terminal 5) and power-supply terminal 7 (hereinafter, terminal 7). Terminal 5 is provided to supply electric power to device 3, and terminal 7 is provided in electronic controller 6.

Device 3 and electronic controller 6 are connected to each other via communication input terminal 8 (hereinafter, terminal 8), communication output terminal 9 (hereinafter, terminal 9), and OUT terminal 12 (hereinafter, terminal 12). Terminal 8 is provided in order to input a signal from electronic controller 6 to device 3. Terminal 9 is provided in order to output a signal from device 3 to electronic controller 6. Terminal 12 is provided in order to output auxiliary power charged in capacitor unit 11 (hereinafter, unit 11) when battery 21 has an abnormal voltage. Abnormal voltage of battery 21 is detected by battery voltage detector 10 (hereinafter, detector 10). Unit 11 is composed of a plurality of capacitors 11a provided in device 3.

The following is a detailed description of the structure of device 3.

Device 3 includes unit 11 as an auxiliary power supply to supply electric power to electronic controller 6 under abnormal conditions of battery 21. Capacitors 11a forming unit 11 are, for example, electric double layer capacitors capable of rapid charge-discharge.

Device 3 further includes charge circuit 13 (hereinafter, circuit 13) to charge unit 11 and discharge circuit 14 (hereinafter, circuit 14) to discharge unit 11. Circuits 13 and 14 are controlled in accordance with the instructions from controller 15. For example, a microcomputer is used as controller 15.

Circuit 13 includes constant current controller 13a, which keeps a voltage rise in unit 11 as constant as possible in charge.

Switch 16 is disposed between detector 10 and electronic controller 6, and supplies auxiliary power from unit 11 to electronic controller 6 via terminal 12 when an abnormal voltage of battery 21 is detected. For example, a FET (field-effect transistor) is used as switch 16.

Device 3 further includes capacitor-unit voltage detector 17a (hereinafter, detector 17a) for detecting the voltage of unit 11 and capacitor-unit current detector 17b (hereinafter, detector 17b) for detecting the current of unit 11.

Device 3 further includes temperature sensor 18 in the vicinity of unit 11 so as to detect the temperature of unit 11 or its ambient temperature. Temperature sensor 18 is formed of a thermistor, which is highly temperature sensitive and easy to form a detection circuit.

Device 3 further includes storage 22 connected to controller 15. Storage 22 stores a plurality of different degradation determination formulas showing the relationship between internal resistance value R and capacitance value C when unit 11 is degraded. A commonly-used ROM is used as storage 22, however alternatively, a nonvolatile RAM (random access memory) or the like may be used. Controller 15 includes determination unit 23, which determines whether unit 11 is degraded or not. Storage 22 may be provided in controller 15. Determination unit 23 may be provided outside controller 15.

Controller 15 is electrically connected to temperature sensor 18, detector 10, circuits 13 and 14, switch 16, detectors 17a and 17b, and storage 22.

In FIG. 2, switch 16 is connected to detector 10 via controller 15. In other words, switch 16 receives instructions from detector 10 via controller 15. Therefore, switch 16 and controller 15 are connected to each other electrically.

The following is a description of the operation of device 3.

First, when switch 2 is turned on to start the operation of vehicle 20, battery 21 supplies a power supply voltage of 12V to controller 15 via terminal 4. This activates vehicle 20. Battery 21 supplies another power supply voltage of 12V to device 3 via terminal 5. Battery 21 supplies further another power supply voltage of 12V to electronic controller 6 via power supply terminal 7.

Next, controller 15 controls circuit 13 so that battery 21 can supply a power supply voltage to unit 11 so as to charge unit 11. In other words, unit 11 accumulates electric charges. At this time, detector 10 detects the voltage of battery 21. When battery 21 is at a specified voltage V0 (hereinafter, V0) or more, the operation of battery 21 is determined to be normal. V0 is set, for example, at 9.5V; however, V0 is not limited to 9.5V and only required to be a voltage that can drive a load such as brakes 25 that battery 21 should drive. When operating normally, battery 21 supplies electric power to terminal 7 so as to perform the braking of vehicle 20 normally. Therefore, there is no request for the auxiliary power from unit 11.

Then, when switch 2 is turned off to terminate the operation of vehicle 20, terminal 4 is turned off, and device 3 sets its operating condition in an off mode. At this time, controller 15 controls circuit 14, so that unit 11 discharges the auxiliary power accumulated therein. In other words, electric charges accumulated in unit 11 are discharged. This extends the life of capacitors 11a.

Device 3 operates as described hereinbefore in a case where battery 21 operates normally. The following is a description of the operation of device 3 in a case where battery 21 has a voltage drop or is under abnormal conditions.

When the voltage detected by detector 10 becomes below specified voltage V0 while vehicle 20 is in use, controller 15 determines that battery 21 is at an abnormal voltage, and turns on switch 16. As a result, the auxiliary power is supplied from unit 11 to electronic controller 6 via terminal 12. Note that fault determination of battery 21 may be performed by determination unit 23 instead of controller 15. When battery 21 is operating normally, switch 16 is controlled in an off state.

Controller 15 also transmits an abnormality signal of battery 21 to terminal 9. Electronic controller 6 makes a display unit (unillustrated) in vehicle 20 display the abnormality of battery 21, thereby informing the driver (unillustrated) of vehicle 20 of the abnormality. Controller 15 then warns the driver to stop vehicle 20 immediately. At this time, the auxiliary power accumulated in unit 11 is supplied to electronic controller 6. This allows the driver to apply brakes 25 so as to stop vehicle 20 safely.

When an abnormality of unit 11 is detected by detector 17a or detector 17b while vehicle 20 is in use, controller 15 transmits an abnormality signal of unit 11 to electronic controller 6 via terminal 9. Electronic controller 6 informs the driver of the abnormality of unit 11. As a result, the driver can have a maintenance company or the like inspect or replace unit 11.

In a sudden trouble in unit 11 caused by a short-circuit or disconnection of capacitors 11a, abnormalities of unit 11 can be detected when detector 17a monitors the voltage of unit 11. However, slowly developing abnormalities of unit 11 that are caused, for example, by degradation of capacitors 11a cannot be easily detected by the aforementioned method.

Figure 3:
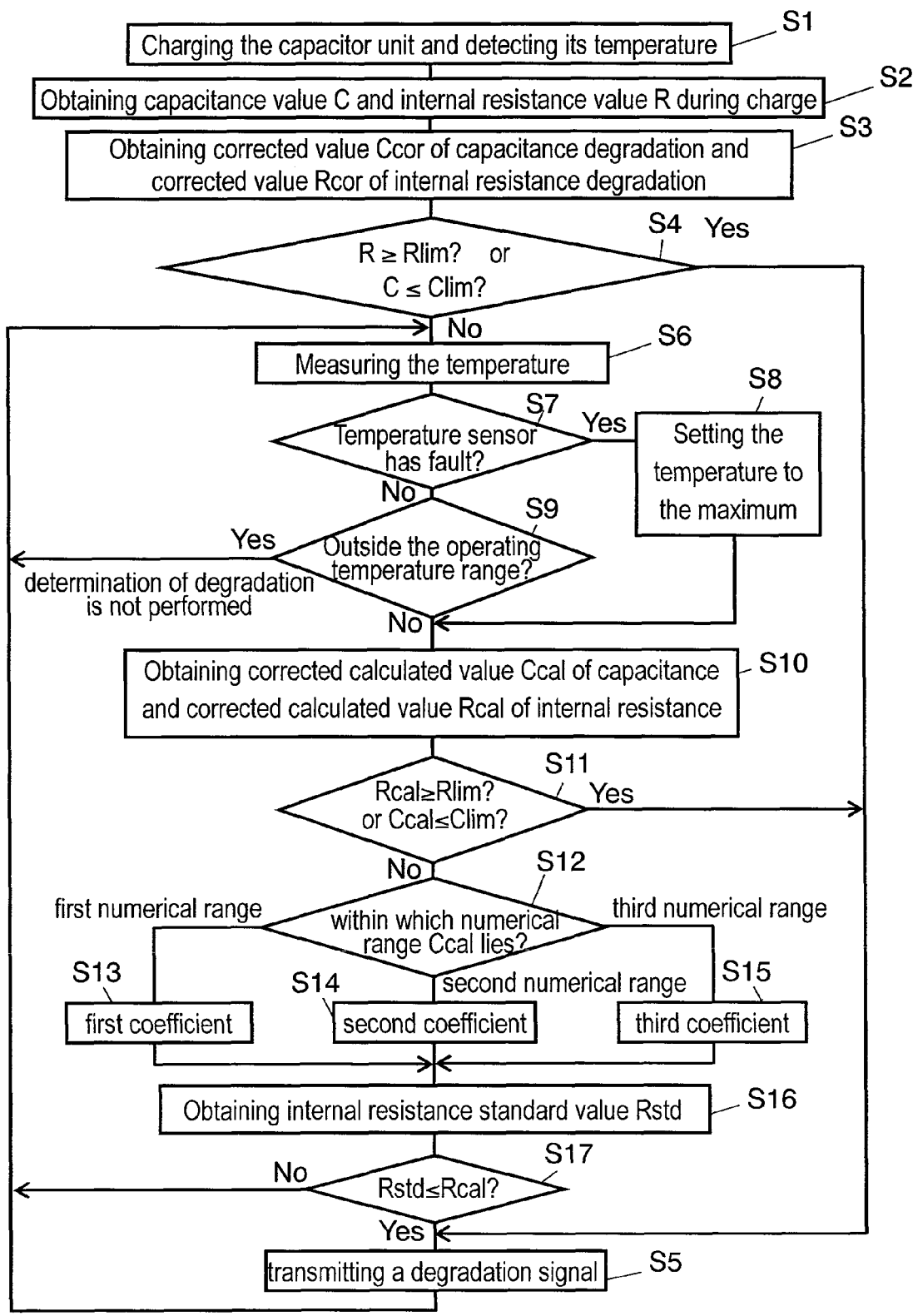
FIG. 3 is a flowchart showing the operation flow of the vehicle power supply device of FIG. 1.

The following is a description, with reference to FIG. 3, of the basic operation of a method for detecting an abnormality of unit 11 caused by degradation of capacitors 11a and a method for determining degradation of vehicle power supply device 3. FIG. 3 is a flowchart showing the operation flow of the vehicle power supply device of the embodiment of the present invention.

As shown in FIG. 3, first of all, when switch 2 is turned on to start vehicle 20, unit 11 is charged with electric charges as auxiliary power. In other words, a charging step is started. At this moment, a first temperature detecting step is performed so that the temperature of unit 11 or its ambient temperature is detected by temperature sensor 18 (Step S1).

When the charge is started, detector 17a starts the detection of a charge voltage to charge unit 11. At the same time, detector 17b performs the detection of a charging current to charge unit 11. Thus, a voltage value detecting step and a current value detecting step are performed.

From the measurement results of the charge voltage and the charging current detected by detectors 17a and 17b, respectively, capacitance value C and internal resistance value R of unit 11 are calculated (Step S2). In other words, an internal-resistance-value-acquiring step and a capacitance-value-acquiring step are performed. Capacitance value C and internal resistance value R are calculated as follows.

Figure 4A:
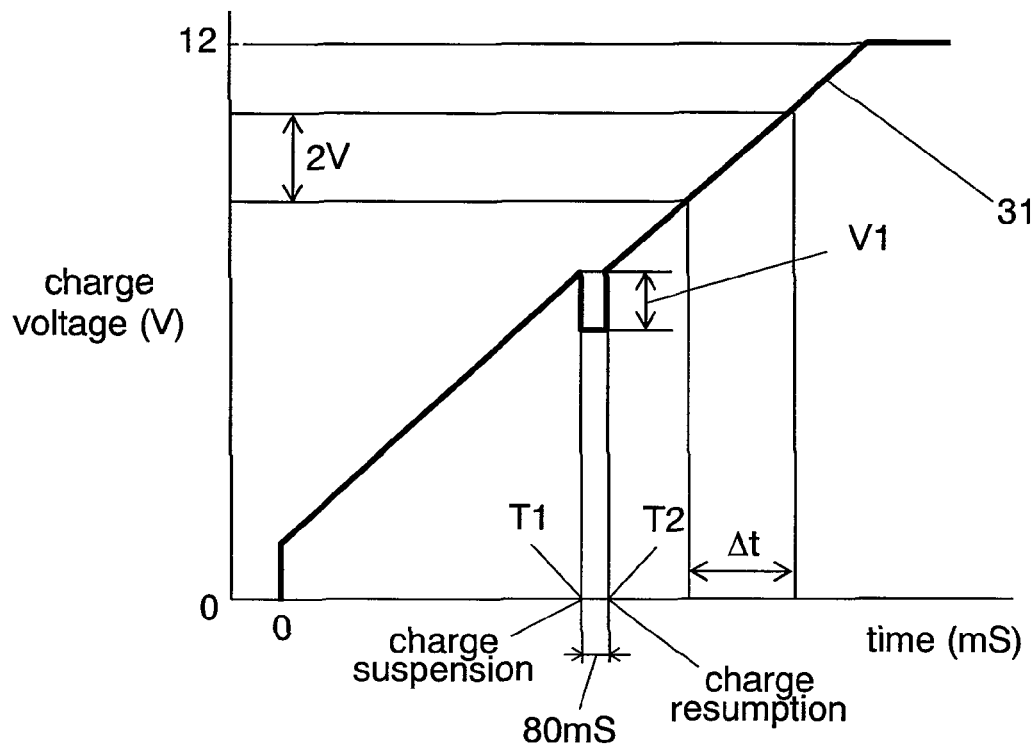
FIG. 4A is a graph showing the change in the voltage value of a capacitor unit with time during charge in the vehicle power supply device of FIG. 1.

FIG. 4A is a characteristic graph showing the change in the charge voltage of the capacitor unit with time during charge in the vehicle power supply device of the embodiment of the present invention. In FIG. 4A, the change of the charge voltage of unit 11 with time is indicated by solid line 31 after the charging of unit 11 at a constant current is started. In FIG. 4A, the horizontal axis represents time and the vertical axis represents the charge voltage of unit 11.

After charging is started, electric charges accumulate with time in unit 11 so as to increase the charge voltage with which unit 11 is to be charged. At time T1, the charging of unit 11 is suspended in charge to unit 11. Thus, the charge voltage of unit 11 is changed. In other words, the charge voltage drops only by internal resistance value R of unit 11. At time T2 when a predetermined time has elapsed, the charging is resumed. In FIG. 4A, the time from suspension to resumption of the charging is 80 mS. Thus, the charge voltage changes before and after the suspension of the charging and before and after its resumption. By utilizing the characteristic that the charge voltage changes before and after the suspension of the charging and before and after its resumption, detector 17a detects voltage drop V1. Voltage drop V1 and current value "i", which is detected by detector 17b in charging, are substituted into a resistance value calculation formula (R=V1/i), thereby obtaining internal resistance value R of unit 11. Alternatively, internal resistance value R may be obtained from voltage rise V1 before and after the resumption of the charging. Accurate internal resistance value R can be obtained by suspending the charging in this manner.

After the charging is resumed, detector 17a detects the voltage change rate of the charge voltage during the charging of unit 11. The voltage change rate is shown by the inclination of solid line 31. The voltage change rate is determined by detecting time Δt required for the charge voltage of unit 11 to achieve a predetermined voltage difference. In FIG. 4A, the predetermined voltage difference is 2V; however, it is not limited to 2V. It may be, for example, 0.2V or 5V if the voltage change rate of the charge voltage is obtained accurately and in a short time.

Figure 4B:
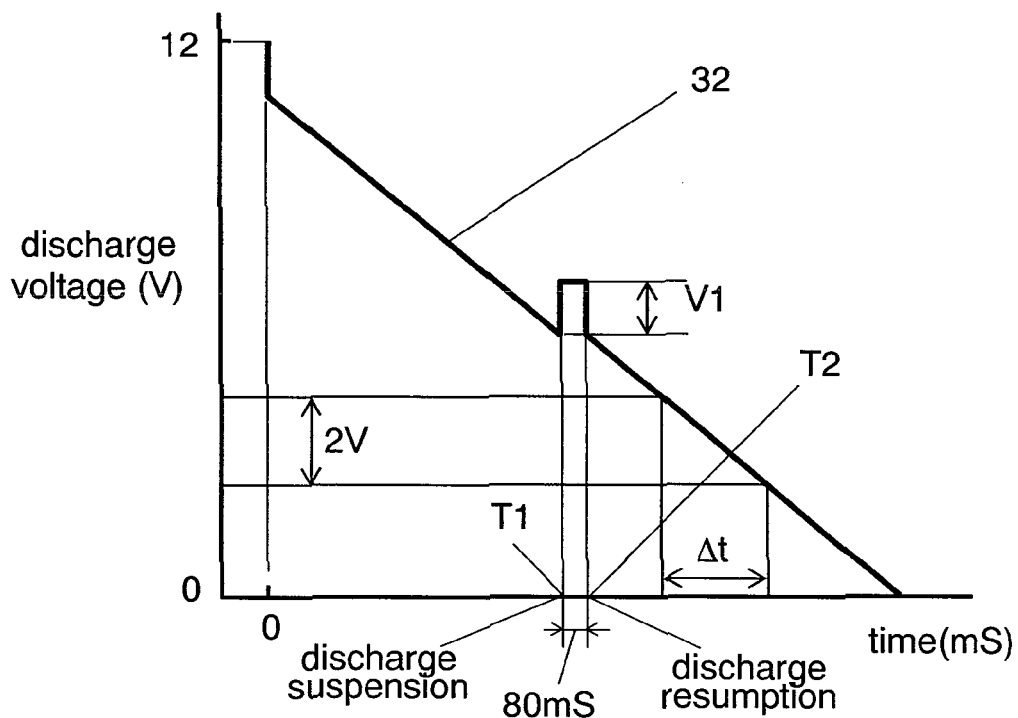
FIG. 4B is a graph showing the change in the voltage value of the capacitor unit with time during discharge in the vehicle power supply device of FIG. 1.

FIG. 4B is a characteristic graph showing the change in the discharge voltage of the capacitor unit with time during discharge in the vehicle power supply device of the embodiment of the present invention. In FIG. 4B, the change of the discharge voltage of unit 11 with time is indicated by solid line 32 after the discharging of unit 11 at a constant current is started. In FIG. 4B, the horizontal axis represents time and the vertical axis represents the discharge voltage of unit 11.

When discharging is started, electric charges releases with time from unit 11, so that the discharge voltage, which is discharged from discharge unit 11, decreases. At time T1, the discharging is suspended in discharging of unit 11, so as to change the discharge voltage of unit 11. In other words, the discharge voltage rises only by internal resistance value R of unit 11. At time T2 when a predetermined time has elapsed, the discharging is resumed. In FIG. 4B, the time from suspension to resumption of the discharging is 80 mS. Thus, the discharge voltage changes before and after the suspension of the discharging and before and after its resumption. By utilizing the characteristic that the discharge voltage changes before and after the suspension of the discharging and before and after its resumption, detector 17a detects voltage rise V1. Voltage rise V1 and current value "i", which is detected by detector 17b during discharge are substituted into a resistance value calculation formula (R=V1/i), thereby obtaining internal resistance value R of unit 11. Alternatively, internal resistance value R may be obtained from voltage drop V1 before and after the resumption of the discharging. Accurate internal resistance value R can be obtained by suspending the discharging in this manner.

After the discharging is resumed, detector 17a detects the voltage change rate of the discharge voltage during the discharging of unit 11. The voltage change rate is shown by the inclination of solid line 32. The voltage change rate is determined by detecting time Δt required for the discharge voltage of unit 11 to achieve a predetermined voltage difference. In FIG. 4B, the predetermined voltage difference is 2V; however, it is not limited to 2V. It may be, for example, 0.2V or 5V if the voltage change rate of the discharge voltage is obtained accurately and in a short time.

As shown in FIGS. 4A and 4B, time Δt can be multiplied by a charging current or a discharging current obtained from the output of detector 17b, and the product can be divided by a predetermined voltage difference (V=2V) to obtain capacitance value C. In other words, electric charge Q can be represented by a formula: electric charge Q=voltage V×capacitance value C. Meanwhile, electric charge Q can be also represented by another formula: electric charge Q=Current i×time Δt. Therefore, a capacitance calculation formula C=(i×Δt)/V holds. This capacitance calculation formula gives capacitance value C of unit 11.

As described hereinbefore, a charge-discharge step is performed in which unit 11 is charged or discharged at a constant current. With the charge-discharge step, a current value detecting step and a voltage value detecting step are performed. Then, an internal-resistance-value-acquiring step is performed based on the voltage value and the current value obtained so as to obtain internal resistance value R. In addition, a capacitance-value-acquiring step is performed based on the voltage change rate and the current value obtained so as to obtain capacitance value C.

In FIG. 4A, the charging of unit 11 is completed when the output of detector 17a reaches 12V, which is the charge end voltage. In FIG. 4B, the discharging of unit 11 is completed when the output of detector 17a reaches 0V, which is the discharge end voltage.

The charge-discharge step is ended when the charging or discharging is complete, so that the measurement using the aforementioned method cannot obtain internal resistance value R or capacitance value C. Therefore, after the charge-discharge step is ended, internal resistance value R and capacitance value C that are obtained in the charge-discharge step are used to estimate the degradation of unit 11 by considering the change in the temperature of unit 11 or its ambient temperature.

The following is a description of a method for determining degradation of unit 11 by estimating the degradation.

Figure 5A:
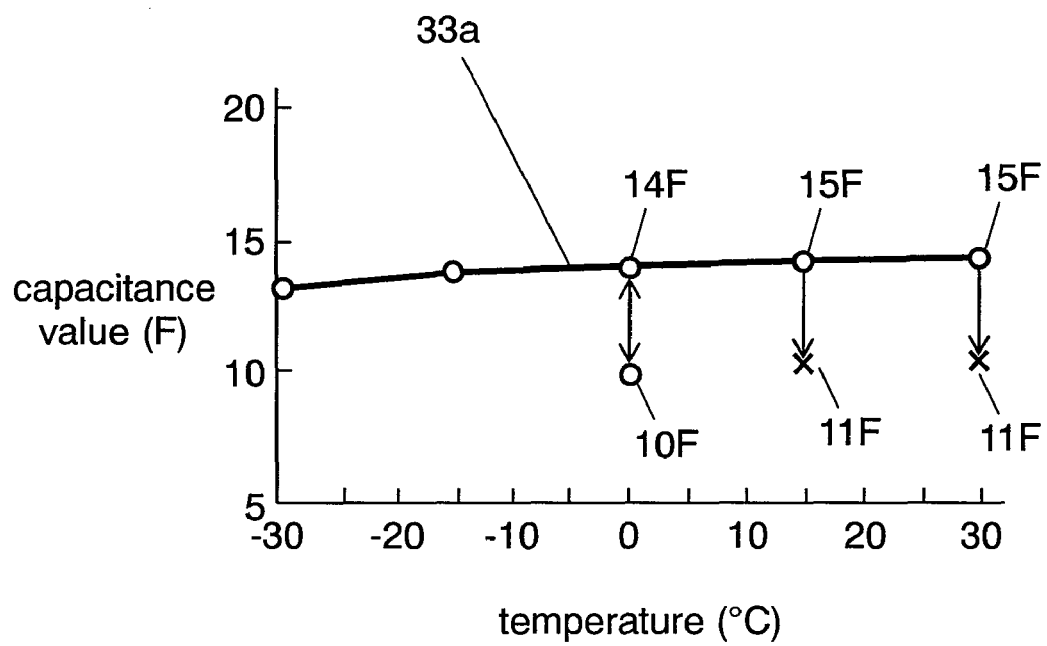
FIG. 5A is a graph showing the change in the capacitance value of the capacitor unit with temperature in the vehicle power supply device of FIG. 1.
Figure 5B:
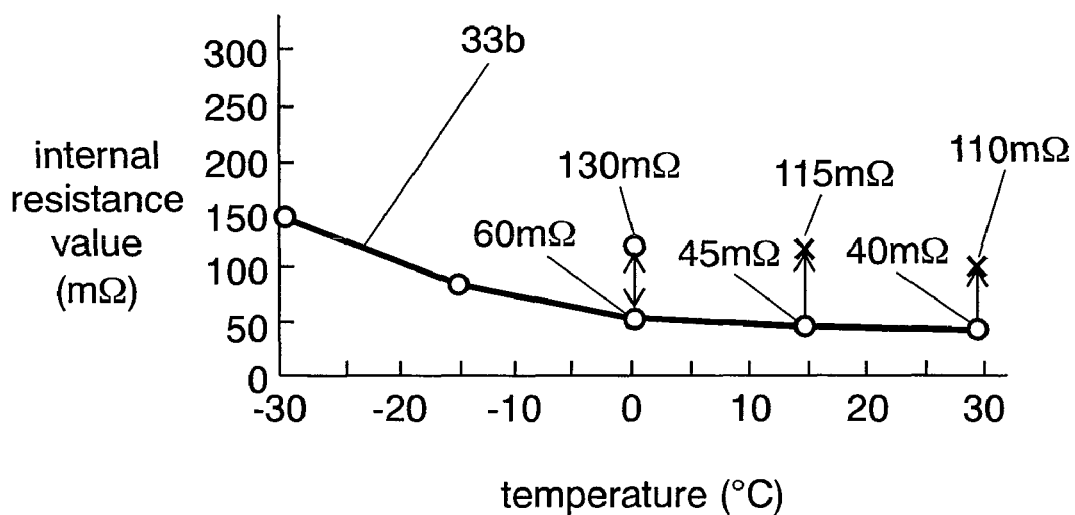
FIG. 5B is a graph showing the change in the internal resistance value of the capacitor unit with temperature in the vehicle power supply device of FIG. 1.

FIGS. 5A and 5B are graphs showing the change in standard properties of the capacitor unit with temperature in the vehicle power supply device of the embodiment of the present invention. FIG. 5A shows the change in the capacitance value with temperature, and FIG. 5B shows the change in the internal resistance value with temperature.

FIG. 5A shows the temperature characteristics of normal value Cnor of capacitance (hereinafter, normal value Cnor), which is the normal value of capacitance value C of unit 11. Normal value Cnor of unit 11 is the average value obtained by measuring capacitance values C of a large number of brand-new units 11. Therefore, capacitance value C of brand-new unit 11 is close to normal value Cnor shown by temperature characteristic line 33a of FIG. 5A.

Capacitance value C of unit 11, however, gradually decreases as unit 11 is used and degraded with time. As a result, for example, when capacitance value C of unit 11 is 10 F at an ambient temperature of 0° C. as shown in FIG. 5A, it is lower by 4 F than normal value Cnor, which is 14 F. This indicates that unit 11 with a decreased capacitance value C has been degraded by 4 F from the brand-new condition. When capacitance value C of unit 11 thus degraded is measured at other temperatures, the difference between normal value Cnor and measured capacitance value C is also 4 F regardless of the temperatures as shown in FIG. 5A. The difference between normal value Cnor and measured capacitance value C is 4 F whether the ambient temperature of unit 11 is, for example, 15° C. or 30° C.

Thus, capacitance value C obtained in Step S2 and normal value Cnor shown by temperature characteristic line 33a make the difference in capacitance value C between unit 11 to be measured and brand-new unit 11 constant regardless of the temperature of unit 11. This facilitates the estimation of capacitance value C at the temperature of unit 11.

When the temperature is, for example, 15° C., normal value Cnor is 15 F as shown in FIG. 5A. This estimates capacitance value C of unit 11 at 15° C. to be 11 F by subtracting 4 F, which is the difference between measured unit 11 and brand-new unit 11.

Measuring capacitance value C of unit 11 at a certain temperature in this manner can estimate the degree of degradation of unit 11 at that moment only from the measured temperature. The difference between capacitance value C of measured unit 11 and normal value Cnor of brand-new unit 11 is defined as corrected value Ccor of capacitance degradation (hereinafter, corrected value Ccor). In other words, corrected value Ccor is obtained from the formula: Ccor=Cnor–C. In the example of FIG. 5A, corrected value Ccor is 4 F. Corrected value Ccor is obtained in Step S3 of the flowchart shown in FIG. 3.

Similarly, internal resistance value R is estimated as follows only by the temperature at which it is measured.

FIG. 5B shows the temperature characteristics at normal value Rnor of internal resistance (hereinafter, normal value Rnor), which is the normal value of internal resistance value R of unit 11. Normal value Rnor of unit 11 is the average value obtained by measuring internal resistance values R of a large number of brand-new units 11. Therefore, internal resistance value R of brand-new unit 11 is close to normal value Rnor shown by temperature characteristic line 33b of FIG. 5B.

Assuming that internal resistance value R of unit 11 at 0° C. is 130 mΩ, normal value Rnor of brand-new unit 11 at 0° C. is 60 mΩ as shown in FIG. 5B. This indicates that internal resistance value R of measured unit 11 is increased by the difference (R–Rnor=70 mΩ) between measured unit 11 and brand-new unit 11. Thus, measured unit 11 has been degraded by the increase of internal resistance value R. The increase in internal resistance value R is defined as corrected value Rcor of internal resistance degradation (hereinafter, corrected value Rcor) of internal resistance value R. In other words, corrected value Rcor is obtained from the formula: Rcor=Rnor–R. Corrected value Rcor is obtained from internal resistance value R obtained in Step S2 of the flowchart of FIG. 3 and from FIG. 5B. Corrected value Rcor is obtained in Step S3 in the same manner as corrected value Ccor.

After corrected values Rcor and Ccor are thus acquired, degradation is determination in Step S4 by using at least one of capacitance value C and internal resistance value R.

More specifically, unit 11 is determined to be degraded when capacitance value C obtained in Step S2 does not satisfy capacitance degradation criterion value Clim (hereinafter, criterion value Clim) of capacitance value C of unit 11. In other words, unit 11 is determined to be degraded when capacitance value C is equal to criterion value Clim or less ("Yes" in Step S4). In addition, unit 11 is determined to be degraded also when internal resistance value R obtained in Step S2 does not satisfy internal resistance degradation criterion value Rlim (hereinafter, criterion value Rlim) of internal resistance value R of unit 11. In other words, unit 11 is determined to be degraded also when internal resistance value R is equal to criterion value Rlim or more ("Yes" in Step S4). When unit 11 is determined to be degraded, controller 15 transmits a degradation (abnormality) signal indicating the degradation of unit 11 to electronic controller 6 via communication output terminal 9 (Step S5). Step S4 is a first degradation determination step. Degradation criterion values Clim and Rlim are previously stored in storage 22. The determination of degradation in the first degradation determination step is performed by determination unit 23.

Criterion value Rlim is a threshold limit value indicating that unit 11 is unusable when internal resistance value R exceeds criterion value Rlim. In the present embodiment, criterion value Rlim is set to about 5 times as large as normal value Rnor of brand-new unit 11. Criterion value Clim is a threshold limit value indicating that unit 11 is usable when capacitance value C is smaller than criterion value Clim. In the present embodiment, criterion value Clim is set to about one fourth of normal value Cnor of brand-new unit 11. Namely, both Rlim=5×Rnor and Clim=Cnor/4 hold.

On the other hand, when it is determined "No" in Step S4, the charging of unit 11 is over, so that internal resistance value R and capacitance value C are estimated as follows.

First, in a second temperature detecting step, the temperature of unit 11 or its ambient temperature are measured (Step S6).

Next, in a temperature sensor fault diagnosis step, temperature sensor 18 is subjected to fault diagnosis (Step S7). When temperature sensor 18 has a fault such as disconnection or short-circuit ("Yes" in Step S7), the detected temperature is not correct, and therefore, the temperature is set to the maximum operating temperature of unit 11 (Step S8). Since then, corrected calculated value Rcal, which is described later, of internal resistance value R is acquired based on the maximum operating temperature so as to determine degradation of unit 11.

The temperature is set to the maximum operating temperature of unit 11 when temperature sensor 18 has a fault because the higher the operating temperature of unit 11, the more severe the degradation standard. In the present embodiment, the maximum operating temperature of unit 11 is set to 30° C.

In the determination of degradation, the maximum operating temperature, which has the most severe load conditions, is used when the correct temperature cannot be detected due to such a fault. As a result, degradation is determined safely without impairing the precision or causing an error in the determination of degradation of unit 11.

When temperature sensor 18 operates normally ("No" in Step S7) and the detected temperature is outside the operating temperature range of unit 11 ("Yes" in Step S9), determination of degradation of unit 11 is not performed. In the present embodiment, the operating temperature range of unit 11 is set to –30° C. to 30° C.

In the present embodiment, a thermistor is used as temperature sensor 18. Therefore, it may have an abnormal sensitivity such as very high or very low when it is used outside the operating temperature range of unit 11. This causes temperature sensor 18 to detect the temperature with lower precision. Moreover, in terms of the material and structure of unit 11, the ability of unit 11 as the auxiliary power supply cannot be fully guaranteed.

For this reason, the determination of degradation of unit 11 is not performed until the temperature detected by temperature sensor 18 is within the operating temperature range. Not performing the determination of degradation is controlled by controller 15.

After Step S8 or "No" in Step S9, a corrected-calculated-value-acquiring step is performed in Step S10. The corrected-calculated-value-acquiring step obtains corrected calculated value Ccal of capacitance (hereinafter, calculated value Ccal) of capacitance value C and corrected calculated value Rcal of internal resistance (hereinafter, calculated value Rcal) of internal resistance value R of unit 11. Calculated values Ccal and Rcal are acquired using the characteristic graphs of FIGS. 5A and 5B, which are based on corrected values Ccor and Rcor, respectively, obtained in Step S3 and the temperature obtained in Step S6 (Step S10). In the present embodiment, Ccor=4 F, and Rcor=70 mΩ.

More specifically, first of all, normal values Cnor and Rnor corresponding to the temperature detected by temperature sensor 18 are acquired from the characteristic graphs of FIGS. 5A and 5B, respectively.

Next, corrected value Ccor with respect to normal value Cnor is subtracted from normal value Cnor to obtain calculated value Ccal. On the other hand, corrected value Rcor with respect to normal value Rnor is added to normal value Rnor to obtain calculated value Rcal. In a word, calculated values Ccal and Rcal are acquired by the formulas: Ccal=Cnor−Ccor, and Rcal=Rnor+Rcor.

Next, similar to Step S4, the determination of degradation of unit 11 is performed by using either calculated value Rcal or Ccal obtained in Step S10. More specifically, unit 11 is determined to be degraded when calculated value Rcal is equal to or more than criterion value Rlim ("Yes" in Step S11) because unit 11 exceeds the degradation limit. Unit 11 is determined to be degraded also when calculated value Ccal is equal to or less than criterion value Clim ("Yes" in Step S11) because unit 11 exceeds the degradation limit. In other words, unit 11 is determined to be degraded when either Rcal≧Rlim or Ccal≦Clim in which unit 11 exceeds the degradation limit. Controller 15 transmits the degradation abnormality signal indicating the degradation of unit 11 to electronic controller 6 via communication output terminal 9 (Step S5). Step S11 is a second degradation determination step. The determination of degradation in the second degradation determination step is performed by determination unit 23.

When "No" in Step S11, determination unit 23 acquires the coefficient of the degradation determination formula corresponding to calculated value Ccal from storage 22 (Steps S12 to S15).

The following is a description of a method for acquiring the coefficient of the degradation determination formula. The details of the degradation determination formula and the coefficient are described later.

When unit 11 supplies power intermittently to a load such as brakes 25, a plurality of different degradation determination formulas are prepared depending on the number of times that unit 11 supplies electric power to the load. The different degradation determination formulas correspond to the numerical ranges of calculated value Ccal. This means that the degradation determination formulas have different coefficients depending on the calculated values Ccal. Therefore, first, in Step S12, it is determined within which numerical range calculated value Ccal lies. Then, calculated value Ccal is determined so as to determine the coefficient of the degradation determination formula to be acquired. Accordingly, the coefficient of the degradation determination formula is acquired as shown in Steps S13 to S15.

First of all, when calculated value Ccal is within the numerical range of the degradation determination formula of the first power supply operation, the first coefficient of the degradation determination formula is acquired (Step S13).

Similarly, when calculated value Ccal is within the numerical range of the degradation determination formula of the second power supply operation, the second coefficient is acquired (Step S14). Similarly, when calculated value Ccal is within the numerical range of the degradation determination formula of the third power supply operation, the third coefficient is acquired (Step S15).

The coefficient and calculated value Ccal acquired in Steps S13 to S15 are substituted into the degradation determination formula. As a result, internal resistance standard value Rstd (hereinafter, standard value Rstd), which is the standard value of degradation of internal resistance value R is obtained (Step S16).

Standard value Rstd, which corresponds to the degradation limit value of unit 11, is compared with calculated value Rcal obtained earlier. If standard value Rstd is equal to or less than calculated value Rcal ("Yes" in Step S17), unit 11 exceeds the degradation limit and therefore is determined to be degraded. In other words, when Rstd≦Rcal, unit 11 exceeds the degradation limit and is determined to be degraded. When unit 11 is determined to be degraded, controller 15 transmits the degradation (abnormality) signal indicating the degradation of unit 11 to electronic controller 6 via communication output terminal 9 (Step S5). Step S17 is a third degradation determination step. The determination of degradation in the third degradation determination step is performed by determination unit 23.

When "No" in Step S17, calculated value Rcal of unit 11 has not reached the degradation limit, so that unit 11 is determined to be normal. As a result, the process returns to Step S6 to repeat the determination of degradation.

The method for determining degradation of the vehicle power supply device is described above. The following is a detailed description of the determination of degradation performed in the second and third degradation determination steps.

First, the example where unit 11 supplies power continuously to a load is described.

Figure 6:
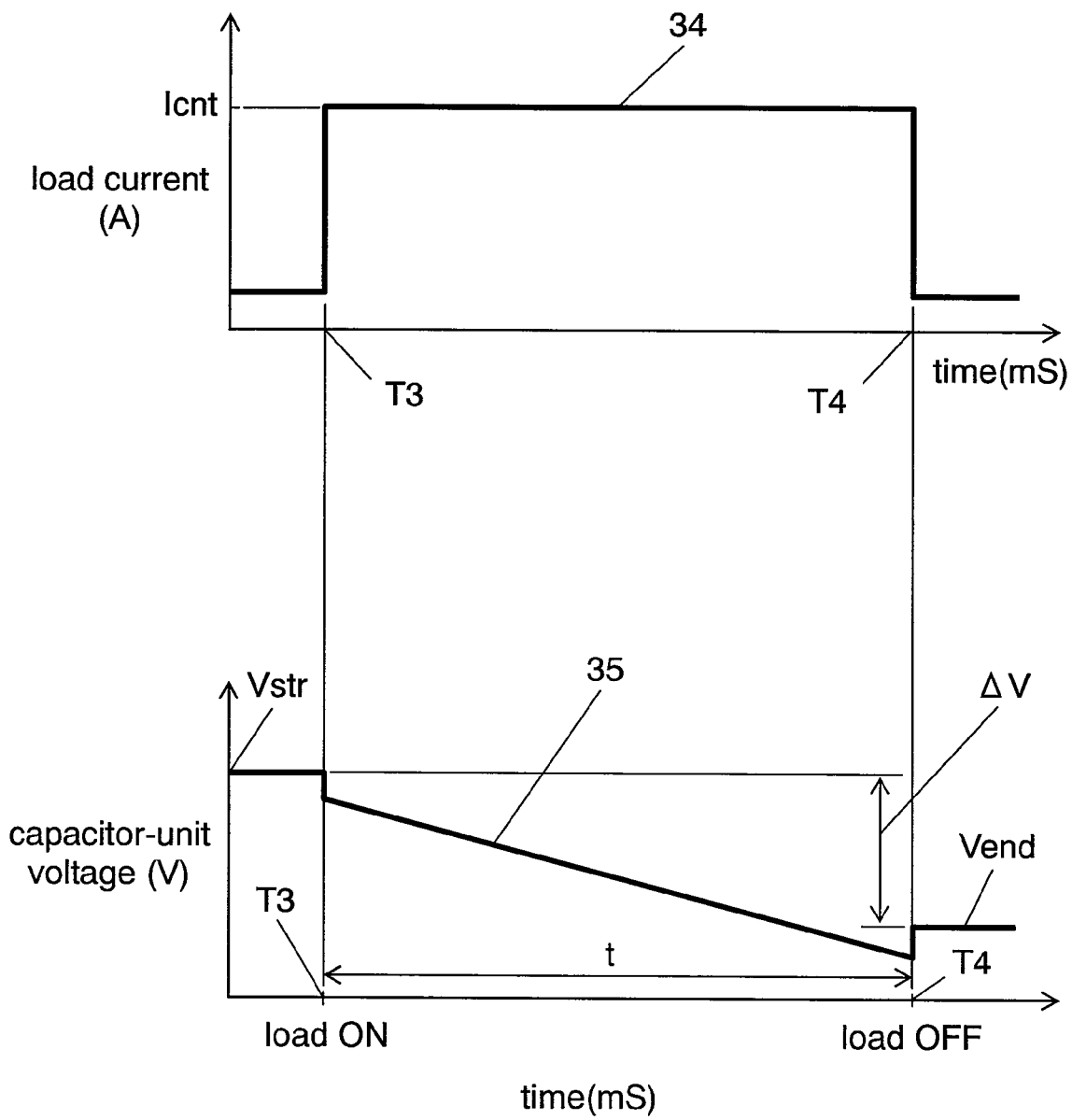
FIG. 6 is a characteristic graph showing the change in the current-voltage characteristics of the capacitor unit with time in the vehicle power supply device of FIG. 1.

FIG. 6 is a characteristic graph showing the change in the current-voltage characteristics of the capacitor unit with time when the vehicle power supply device of the embodiment of the present invention supplies power continuously to a load. In the case where the power is supplied continuously to the load, the changes of load current 34 supplied from unit 11 and capacitor-unit voltage 35 (hereinafter, voltage 35) with time, which is the voltage of unit 11 are shown in FIG. 6.

As shown in FIG. 6, at time T3, the load is turned on by unit 11 (load ON). At the same time, at time T3, voltage 35 slightly drops from start voltage Vstr (hereinafter, Vstr), which is the voltage level before the load is turned on. Voltage 35 continues to decrease while load current 34 flows continuously as constant load current Icnt (hereinafter, Icnt). At time T4 when time t has elapsed, the load is turned off. Consequently, voltage 35 slightly increases and becomes end voltage Vend (hereinafter, Vend), which is a fixed voltage value.

Figure 7A:
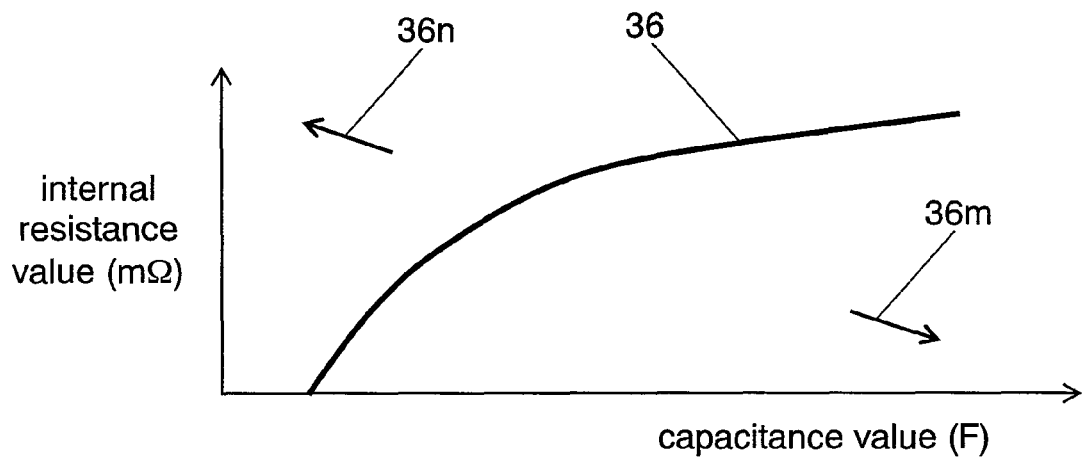
FIG. 7A is a typical correlation graph showing the relationship between the capacitance value and an internal-resistance-degradation-standard value of the vehicle power supply device of FIG. 1 based on a degradation determination formula.

When unit 11 is used as described above, standard value Rstd with respect to capacitance value C is shown in curved line 36 of FIG. 7A. Therefore, standard value Rstd is easily obtained by substituting calculated value Ccal of unit 11 into the degradation determination formula shown in curved line 36.

When standard value Rstd is equal to or less than calculated value Rcal, unit 11 is determined to be degraded. This means that unit 11 is determined to be degraded when calculated value Rcal is on or above curved line 36 as indicated by arrow 36n. In the contrary, when calculated value Rcal is below curved line 36 as indicated by arrow 36m, unit 11 is determined to be normal.

In general, when capacitors 11a are degraded, capacitance value C tends to decrease, and internal resistance value R tends to increase. Consequently, as shown in FIG. 7A, unit 11 is closer to its brand-new condition when standard value Rstd is lower and more right indicated by arrow 36m, and more degraded when standard value Rstd is higher and more left indicated by arrow 36n. Thus, curved line 36 indicates whether unit 11 is normal or degraded.

The following is a detailed description of the degradation determination formulas.

Assume that the voltage of battery 21 becomes lower than specified voltage V0 and that controller 15 turns switch 16 on. In other words, assume that device 3 makes unit 11 supply auxiliary power to electronic controller 6. Also assume that the driver applies braking to vehicle 20 when the auxiliary power is supplied from unit 11 to electronic controller 6. In other words, assume that members such as brakes 25 that are operated by braking act as the load of unit 11.

The voltage of unit 11 is Vstr before device 3 is started, but is assumed to have become Vend as a result that fixed load current Icnt flows from unit 11 during the period of time t after device 3 is started. In other words, assume that unit 11 shows load current 34 and capacitor-unit voltage 35 as shown in FIG. 6.

The members such as brakes 25 as the load of unit 11 are required to be driven safely, so that Vend is required to be equal to voltage Vmin (hereinafter, Vmin) or more. Vmin is a power supply voltage minimum required for electronic controller 6 to operate normally. Accordingly, it is necessary to satisfy formula (1) below:

$$Vend \geq Vmin \quad \text{formula (1)}$$

On the other hand, voltage drop $\Delta V$ of unit 11 is expressed by formula (2) below:

$$\Delta V = Vstr - Vend \quad \text{formula (2)}$$

When formula (2) is substituted into formula (1), the following formula is obtained:

$$Vstr - \Delta V \geq Vmin$$

The formula can be converted to formula (3) below:

$$\Delta V \leq Vstr - Vmin \quad \text{formula (3)}$$

Voltage drop $\Delta V$ contains a voltage drop caused by the power consumed by the braking of vehicle 20. Voltage drop $\Delta V$ can also be expressed as the sum of the voltage drops caused by the power consumption of the wiring system or the internal resistance of capacitors 11a.

Voltage drop Vload caused by the braking of vehicle 20 is expressed by the following formula:

$$Q = C \times Vload,$$

where Q is an electric charge amount of unit 11 and C is the capacitance value of unit 11

The above formula is converted to obtain formula (4) below:

$$Vload = Q/C \quad \text{formula (4)}$$

In formula (4), electric charge amount Q indicates electric charges to be consumed by the braking of vehicle 20, and can be expressed as formula (5) below:

$$Q = Icnt \times t \quad \text{formula (5)}$$

Formula (5) is substituted into formula (4) to obtain formula (6) below:

$$Vload = (Icnt \times t)/C \quad \text{formula (6)}$$

Voltage drop Vdr caused by the wiring system is expressed by formula (7) below:

$$VdR = Vf + (Rloss \times Icnt) \quad \text{formula (7),}$$

where Vf is a fixed voltage drop showing a weak current dependence like a diode, and Rloss is a total resistance value of the resistance value of the wiring system and the resistance values of switching elements and the like.

Voltage drop Vc caused by the internal resistance of capacitors 11a is expressed by formula (8) below:

$$Vc = R \times Icnt \quad \text{formula (8),}$$

where R is the internal resistance value of unit 11

Through formulas (6) and (7), voltage drop $\Delta V$ of unit 11 as a whole is expressed by formula (9) below:

$$\Delta V = Vc + Vload + Vdr = R \times Icnt + (Icnt \times t)/C + Vdr \quad \text{formula (9)}$$

Formula (9) can be substituted into formula (3) to be expressed in formula (10) below:

$$(Vstr - Vmin) \geq R \cdot Icnt + (Icnt \times t)/C + Vdr \quad \text{formula (10)}$$

Formula (10) can be converted to formula (11) below:

$$R \leq ((Vstr - Vmin) - Vdr - (Icnt \times t)/C)/Icnt \quad \text{formula (11)}$$

In formula (11), when the temperature is kept constant, Vstr, Vmin, Vdr, Icnt, and t are all kept constant. Consequently, formula (11) can be expressed by formula (12) below:

$$R \leq A - B/C \quad \text{formula (12),}$$

where A and B are coefficients and can be constants expressed by $$A = (Vstr - Vmin - Vdr)/Icnt, \text{ and}$$

$$B = (Icnt \times t)/Icnt = t.$$

As the requirements of unit 11 to meet the requirements to drive the load, formula (12) provides the relational expression of capacitance value C and internal resistance value R. In other words, in theory, capacitance value C and internal resistance value R need to satisfy formula (12).

Coefficients A and B are set so that unit 11 is more likely to be determined to be degraded by considering margins, for example, for measurement errors of internal resistance value R and capacitance value C of unit 11. More specifically, internal resistance value R is given a 20% margin, and capacitance value C is given a 15% margin. Consequently, formula (12) can be replaced by degradation determination formula (13) below:

$$R \leq 0.8 \times (A - (B/C) \times 1.15) \leq A' - B'/C \quad \text{formula (13),}$$

where A' and B' are coefficients and constants after the margins such as measurement errors are added. The result of the calculation of degradation determination formula (13) is standard value Rstd.

Degradation determination formula (13) thus obtained is shown in curved line 36 of FIG. 7A.

Figure 7B:
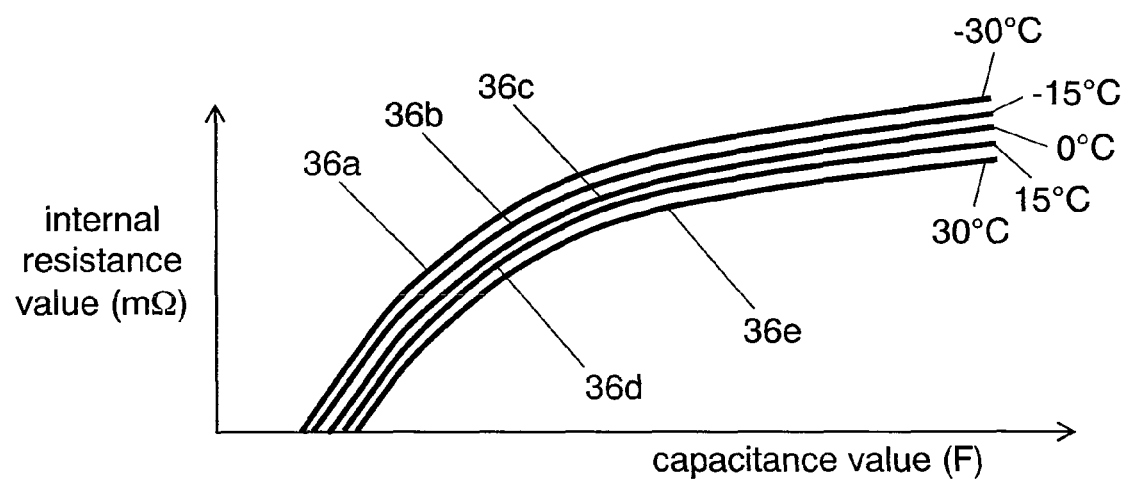
FIG. 7B is a correlation graph with respect to each temperature showing the relationship between the capacitance value and the internal-resistance-degradation-standard value of the vehicle power supply device of FIG. 1 based on degradation determination formulas.

FIGS. 7A and 7B are correlation graphs showing the relationship between the capacitance value and the internal-resistance-degradation-standard value obtained by the degradation determination formula when the vehicle power supply device of the embodiment of the present invention supplies power continuously to the load. FIG. 7A is a typical correlation graph, and FIG. 7B is a correlation graph with respect to each temperature.

Coefficients A' and B' change with temperature. In other words, coefficients A' and B' include temperature coefficients, so that different degradation determination formulas (13) are used depending on the temperature. The degradation determination formulas (13) different from each other with different temperatures are depicted in curved lines 36a, 36b, 36c, 36d, and 36e as shown in FIG. 7B. Curved lines 36a, 36b, 36c, 36d, and 36e represent degradation determination formulas (13) at −30° C., −15° C., 0° C., 15° C., and 30° C., respectively.

Consequently, coefficients A' and B' corresponding to the respective temperatures are substituted into degradation determination formulas (13). As a result, the degradation determination formulas with respect to the temperatures detected by temperature sensor 18 are obtained.

As described above, it becomes possible to perform the determination of degradation more accurately than ever, depending on the temperature detected by temperature sensor 18.

The method for determining degradation when unit 11 supplies power continuously to the load is described above.

In contrast, the following is a detailed description of the determination of degradation when unit 11 supplies power intermittently to the load.

Figure 9A:
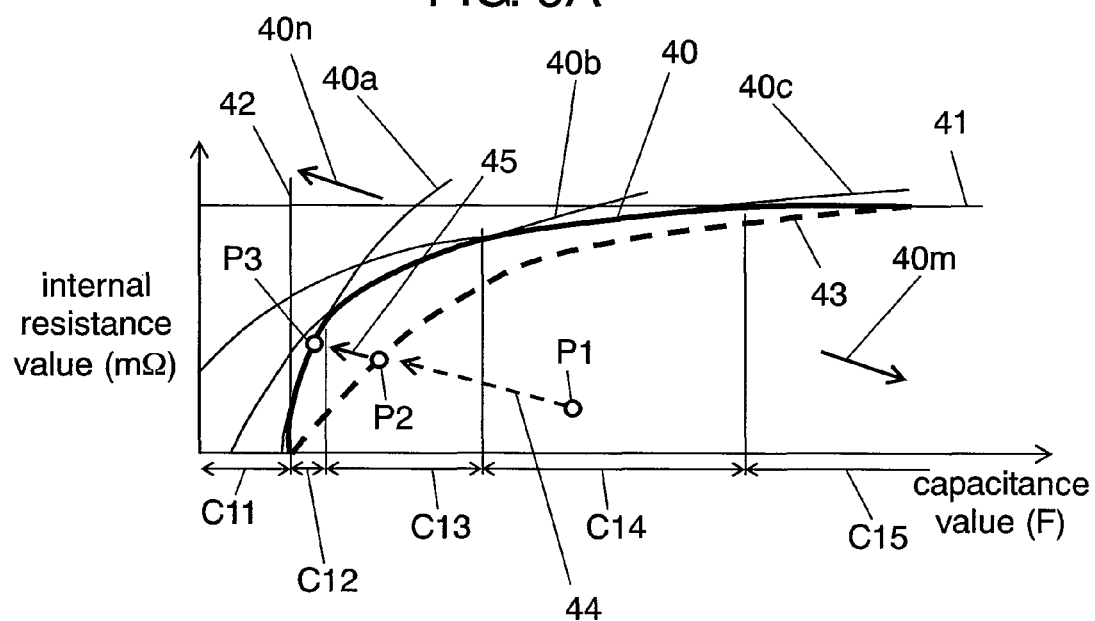
FIG. 9A is a typical correlation graph showing the relationship between the capacitance value and the internal-resistance-degradation-standard value of the vehicle power supply device of FIG. 1 based on degradation determination formulas.
Figure 9B:
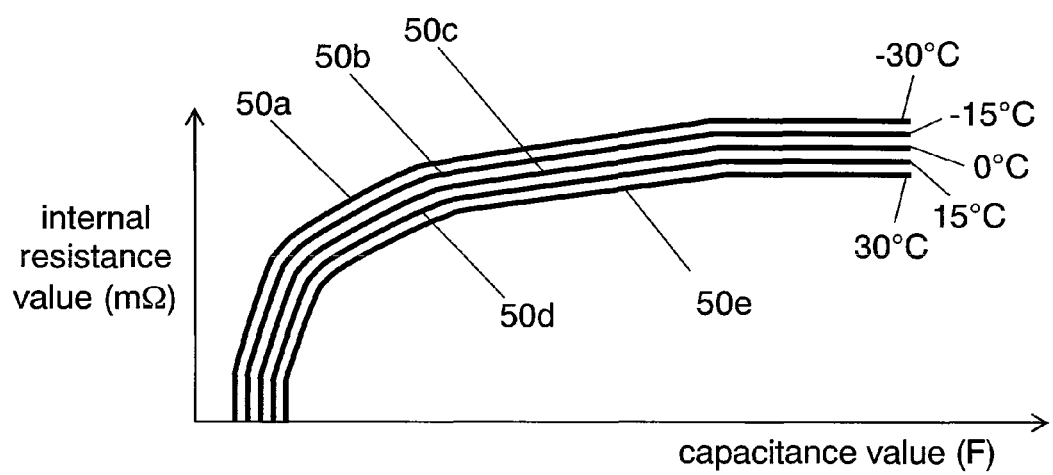
FIG. 9B is a correlation graph with respect to each temperature showing the relationship between the capacitance value and the internal-resistance-degradation-standard value of the vehicle power supply device of FIG. 1 based on degradation determination formulas.
Figure 10:
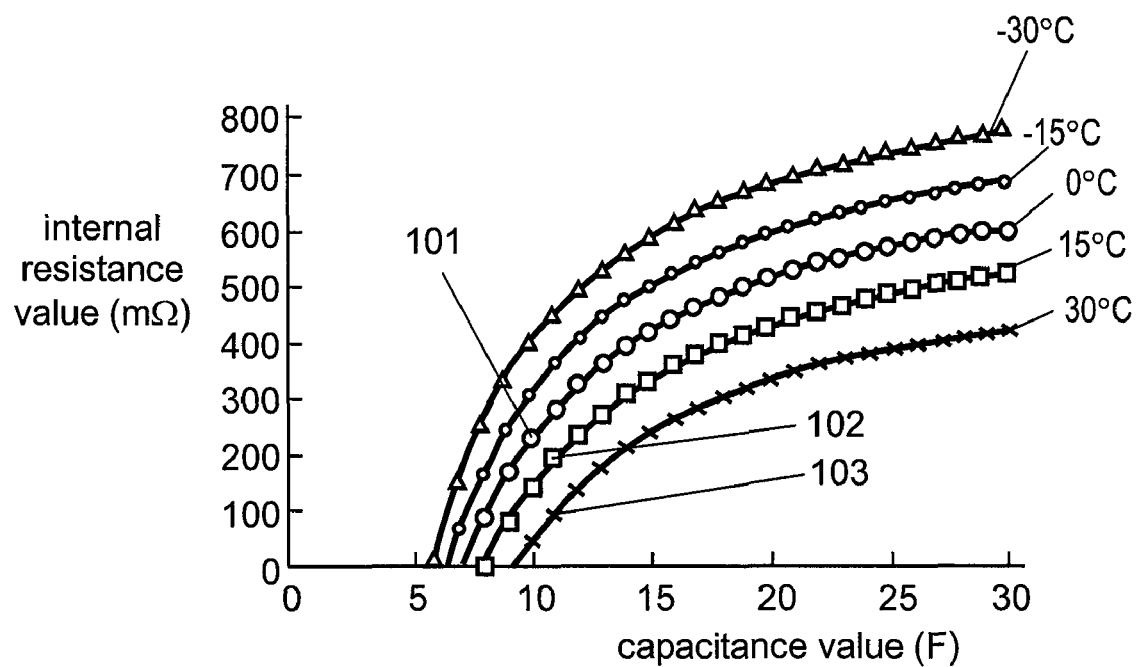
FIG. 10 is a correlation graph showing the relationship between a capacitance value and the degradation standard value of an internal resistance value of the capacitor unit of a conventional vehicle power supply device, based on degradation determination formulas.

FIG. 8 is a graph showing the change in the current-voltage characteristics of the capacitor unit with time in the vehicle power supply device of the embodiment of the present invention when the capacitor unit supplies power intermittently to the load. In FIG. 8, the upper graph shows the change of a load current with time, and the lower graph shows the change of a capacitor-unit voltage with time. FIGS. 9A and 9B are correlation graphs showing the relationship between the capacitance value and the internal-resistance-degradation-standard value obtained by degradation determination formulas in the vehicle power supply device of the embodiment of the present invention when the capacitor unit supplies power intermittently to the load. FIG. 9A is a typical correlation graph, and FIG. 9B is a correlation graph with respect to each temperature.

FIG. 8 shows the change of load current 38 flowing from unit 11 and capacitor-unit voltage 39 (hereinafter, voltage 39) with time when unit 11 supplies power intermittently to the load. In the case shown in FIG. 8, the power supply is intermitted three times.

As shown in FIG. 8, at time T11, the load is turned on by unit 11 (load ON) at a first power supply operation. At the same time, at time T11, voltage 39 slightly drops from start voltage Vstr, which is the voltage level before the load is turned on. Voltage 39 continues to decrease while load current 38 flows continuously as constant load current Icnt. At time T12 when time t1 has elapsed, the load is turned off. Consequently, voltage 39 slightly increases and becomes a fixed voltage value.

At time T21, the load is turned on by unit 11 (load ON) at a second power supply operation. At the same time, at time T21, voltage 39 slightly drops from the voltage level before the load is turned on. Voltage 39 continues to decrease while load current 38 flows continuously again as constant load current Icnt. At time T22 when time t2 has elapsed, the load is turned off. Consequently, voltage 39 slightly increases and becomes a fixed voltage value.

Similarly, at time T31, the load is turned on by unit 11 (load ON) at a third power supply operation. At the same time, at time T31, voltage 39 slightly drops from the voltage level before the load is turned on. At time T32 when time t3 has elapsed, the load is turned off while load current 38 flows continuously again as constant load current Icnt. Consequently, voltage 39 slightly increases and becomes end voltage Vend, which is a fixed voltage value.

Standard value Rstd with respect to capacitance value C of unit 11 when unit 11 supplies electric power intermittently to the load is shown in FIG. 9A. As shown in FIG. 9A, standard value Rstd is shown in three curved lines 40a, 40b, and 40c depending on the number of times that unit 11 supplies electric power to the load. Three curved lines 40a, 40b, and 40c represent degradation determination formulas.

More specifically, the degradation determination formula is shown in curved line 40a at the first power supply operation; in curved line 40b at the second power supply operation; and in curved line 40c at the third power supply operation, respectively.

Therefore, as shown in FIG. 9A, coefficients A' and B' used in the degradation determination formulas are constants different from each other depending on the numerical ranges of calculated value Ccal, which is substituted into the degradation determination formulas. Namely, coefficients A' and B' that correspond to one of curved lines 40a, 40b, and 40c are used.

For example, when calculated value Ccal is within the numerical range of C12 on the horizontal axis of FIG. 9A, degradation of unit 11 is determined by using the degradation determination formula of curved line 40a.

Similarly, when calculated value Ccal is within the numerical range of C13 shown on the horizontal axis of FIG. 9A, degradation of unit 11 is determined by using the degradation determination formula of curved line 40b. When calculated value Ccal is within the numerical range of C14 shown on the horizontal axis of FIG. 9A, degradation of unit 11 is determined by using the degradation determination formula of curved line 40c.

In FIG. 9A, flexure line 40 is formed by merging curved lines 40a, 40b, and 40c so as to maximize capacitance value C and to minimize internal resistance value R. Flexure line 40 shown in FIG. 9A becomes a degradation determination line when unit 11 supplies electric power intermittently to the load. As a result, unit 11 is determined to be normal when calculated value Rcal is below flexure line 40, which is the side indicated by arrow 40m. On the other hand, unit 11 is determined to be degraded when calculated value Rcal is above flexure line 40, which is the side indicated by arrow 40n.

FIG. 9A also shows the determination in the second degradation determination step of Step S11. In Step S11, prior to the third determination in Step S17, criterion value Rlim or Clim, which are degradation limitation characteristics of unit 11, is compared with calculated value Rcal or Ccal, respectively. In FIG. 9A, criterion values Rlim and Clim are shown in straight lines 41 and 42, respectively. Flexure line 40, which is formed by merging curved lines 40a, 40b, and 40c as described above, also takes criterion values Rlim and Clim into consideration. More specifically, criterion value Rlim represents the maximum value of internal resistance value R shown in flexure line 40, and criterion value Clim represents the minimum value of capacitance value C shown in flexure line 40.

As described above, three degradation determination formulas used when unit 11 supplies electric power intermittently to the load are shown in curved lines 40a, 40b, and 40c. In other words, the number of the degradation determination formulas used in the determination of degradation of unit 11 corresponds to the number of times that unit 11 supplies electric power intermittently to the load. For example, when the electric power is supplied four times, four degradation determination formulas are used. When the power is supplied six times, six degradation determination formulas are used. Therefore, the number of times that unit 11 supplies electric power intermittently to the load is assumed, and the number of assumed degradation determination formulas larger than the number of times that the electric power is supplied intermittently is previously stored in storage 22.

As described above, it is difficult to express flexure line 40 in a single formula. Therefore, first, when calculated value Ccal is in region C11 or C15 on the horizontal axis of FIG. 9A, unit 11 is determined to be degraded or not, using two degradation determination formulas (Rcal≧Rlim or Ccal≦Clim) shown in Step S11. On the other hand, when calculated value Ccal is in region C12, C13, or C14 on the horizontal axis of FIG. 9A, appropriate coefficients A' and B' are selected by the numerical range of calculated value Ccal and then acquired from storage 22. Coefficients A' and B' thus acquired are substituted into degradation determination formulas (curved line 40a, 40b, or 40c) according to the range so as to perform the determination of degradation.

The following is a description of features by comparing the method for determining degradation according to the embodiment of the present invention using a plurality of different degradation determination formulas with a conventional method using a single degradation determination formula. The single degradation determination formula used in the conventional method is shown in dashed line 43 of FIG. 9A.

In FIG. 9A, calculated values Ccal and Rcal are represented by coordinates P1 (C2, R1) when unit 11 is brand-new. In the conventional method, unit 11 is determined to be degraded using the single degradation determination formula shown in dashed line 43. As indicated by arrow 40m of FIG. 9A, coordinates P1 (C2, R1) are obviously below dashed line 43 representing the single degradation determination formula, so that unit 11 is determined to be normal. The same results can be obtained when criterion value Rstd is acquired by substituting corrected calculated value C1 of capacitance (hereinafter, calculated value C1) into formula (13) and compared with corrected calculated value R1 of internal resistance.

In contrast, when unit 11 is determined to be degraded or not based on the method of the embodiment using three degradation determination formulas, the degradation determination formula shown in curved line 40c is used because the numerical range of calculated value C1 is in region C14.

Substituting coefficients A' and B' shown in curved line 40c and calculated value C1 into degradation determination formula (13) gives Rstd>R1. This result is also apparent from the fact that in FIG. 9A, coordinates P1 (C2, R1) are below flexure line 40, which is the side indicated by arrow 40m. Thus, in the method of the present embodiment, unit 11 is determined not to have been degraded yet as in the conventional method.

Next, assume that unit 11 has been more degraded during use. For example, assume that calculated values Ccal and Rcal change in the direction of dotted arrow 44 shown in FIG. 9A and become coordinates P2 (C2, R2). As described above, in general, when capacitors 11a are degraded, capacitance value C tends to decrease and internal resistance value R tends to increase.

In the case where unit 11 is determined to be degraded or not at coordinates P2 (C2, R2) according to the conventional method, corrected calculated value C2 of capacitance (hereinafter, calculated value C2) is substituted into degradation determination formula (13) so as to calculate standard value Rstd. The result is Rstd=R2, and corrected calculated value R2 of internal resistance is exactly on dashed line 43 representing the degradation determination formula. In other words, when the conventional method is used, unit 11 is determined to be degraded at coordinates P2 (C2, R2).

On the other hand, when unit 11 is determined to be degraded or not according to the method of the present embodiment, the degradation determination formula shown in curved line 40b is used because the numerical range of calculated value C2 is in region C13.

Coefficients A' and B' shown in curved line 40b and calculated value C2 are substituted into degradation determination formula (13) to give Rstd>R2. This result is also apparent from the fact that in FIG. 9A, coordinates P2 (C2, R2) are below flexure line 40, which is the side indicated by arrow 40m. Thus, in the method of the present embodiment, unit 11 is determined not to have been degraded at coordinates P2 (C2, R2).

As apparent from the above description, the conventional method determines the degradation of unit 11 inaccurately when unit 11 supplies power intermittently to a load. In other words, in the conventional method, unit 11 is determined to be degraded when it actually is not degraded. In contrast, the method of the present embodiment determines the degradation of unit 11 accurately in the same condition.

Assume that unit 11 is further degraded as indicated by solid arrow 45 of FIG. 9A and reaches coordinates P3 (C2, R3).

In the conventional method, as apparent from FIG. 9A, coordinates P3 (C2, R3) are above dashed line 43 representing the degradation determination formula, which is the side indicated by arrow 40n. As a result, unit 11 is determined to be degraded before reaching coordinates P3 (C2, R3).

On the other hand, when unit 11 is determined to be degraded or not in the method of the present embodiment using three degradation determination formulas, the numerical range of corrected calculated value 3C of capacitance (hereinafter, calculated value 3C) is in region C12. Therefore, the degradation determination formula shown in curved line 40a is used.

Coefficients A' and B' shown in curved line 40a and calculated value 3C are substituted into degradation determination formula (13) to give Rstd=R3. This result indicates that unit 11 is determined to be degraded when it reaches coordinates P3 (C2, R3).

Summing up the above, the conventional method determines that unit 11 at coordinates P2 (C2, R2) is degraded when it actually is not degraded. This causes the life of unit 11 to be estimated shorter than its actual life by the time between coordinates P2 (C2, R2) and coordinates P3 (C2, R3) which are the actual degradation requirements. As a result, unit 11 is erroneously determined to be degraded when it is actually usable, without completing its life cycle.

In contrast, the method of the present embodiment can determine the degradation of unit 11 more accurately than ever close to the end of the actual life.

Consequently, as shown in FIG. 9A, the life of unit 11 is determined more accurately than in the conventional method by the lifetime corresponding to the region surrounded by flexure line 40 and dashed line 43.

In the determination of degradation using a plurality of different degradation determination formulas according to the present embodiment, coefficients A' and B' change with temperature as shown in FIG. 9B. In FIG. 9B, in the same manner as in FIG. 7B, the degradation determination requirements are different depending on the temperature. The degradation determination requirements different from each other with different temperatures are depicted in broken lines 50a, 50b, 50c, 50d, and 50e as shown in FIG. 9B. Broken line 50a, 50b, 50c, 50d, and 50e represent degradation determination requirements at −30° C., −15° C., 0° C., 15° C., and 30° C., respectively.

As described hereinbefore, storage 22 connected to controller 15 includes a plurality of degradation determination formulas in accordance with the temperatures, and also includes the coefficients of the degradation determination formulas with respect to the temperatures. An appropriate one of the coefficients is applied according to the temperature at which unit 11 is determined to be degraded or not.

The above-described structure and operation of vehicle power supply device 3 performs the determination of degradation more accurately than the conventional vehicle power supply device. This provides vehicle power supply device 3 in which unit 11 can be used to the end of its actual life, and a method for determining degradation of the device.

INDUSTRIAL APPLICABILITY

The vehicle power supply device and the method for determining degradation of the device of the present invention, which enable the capacitor unit to be used to the end of the actual life, are particularly useful to provide an emergency power supply or the like for an electronic braking system which electrically brakes the vehicle.

The invention claimed is:

1. A vehicle power supply device comprising:
a capacitor unit including a plurality of capacitors storing auxiliary power;
a temperature sensor detecting a temperature of the capacitor unit;
a charge circuit charging electric power to the capacitor unit;
a capacitor-unit current detector detecting a current value of the capacitor unit;
a capacitor-unit voltage detector detecting a voltage value of the capacitor unit;
a controller electrically connected to the temperature sensor, the charge circuit, the capacitor-unit current detector, and the capacitor-unit voltage detector, the controller obtaining an internal resistance value and a capacitance value of the capacitor unit from the voltage value and the current value;
a storage storing a correction calculation formula and a plurality of degradation determination formulas, the correction calculation formula being used to perform the correction calculation of the internal resistance value and the capacitance value in accordance with the temperature in order to obtain a corrected calculated value of internal resistance and a corrected calculated value of capacitance, and the plurality of degradation determination formulas corresponding to numerical ranges of the corrected calculated value of capacitance and being used to calculate an internal resistance standard value from the corrected calculated value of capacitance; and
a determination unit determining a degradation level of the capacitor unit based on at least one of the internal resistance standard value and the corrected calculated value of capacitance.

2. The vehicle power supply device of claim 1, wherein
when the capacitor unit is charged at a constant current, the controller makes the capacitor-unit voltage detector detect a change in a charge voltage value of the capacitor unit before and after a charging operation is suspended or before and after the charging operation is resumed;
the controller acquires the internal resistance value of the capacitor unit based on the voltage value detected by the capacitor-unit voltage detector and the current value detected by the capacitor-unit current detector; and
the controller acquires the capacitance value of the capacitor unit based on a charge-voltage-change rate of the capacitor unit during charge and the current value detected by the capacitor-unit current detector.

3. The vehicle power supply device of claim 1, further comprising:
a discharge circuit discharging the electric power charged in the capacitor unit, wherein
when the capacitor unit is discharged at a constant current, the controller makes the capacitor-unit voltage detector detect a change in a discharge voltage value of the capacitor unit before and after a discharging operation is suspended or before and after the discharging operation is resumed;
the controller acquires the internal resistance value of the capacitor unit based on the voltage value detected by the capacitor-unit voltage detector and the current value detected by the capacitor-unit current detector; and
the controller acquires the capacitance value of the capacitor unit based on a discharge-voltage-change rate of the capacitor unit during discharge and the current value detected by the capacitor-unit current detector.

4. The vehicle power supply device of claim 1, further comprising:
a switch electrically connected to the controller, the switch being switched to output electric power from the capacitor unit when output of the auxiliary power is requested.

5. The vehicle power supply device of claim 1, further comprising:
a load connected to the capacitor unit, wherein
the number of the degradation determination formulas used to calculate the internal resistance standard value is equal to the number of times that the capacitor unit supplies electric power intermittently to the load.

6. The vehicle power supply device of claim 1, wherein the controller includes the determination unit.

7. The vehicle power supply device of claim 1, wherein the determination unit determines that the capacitor unit is degraded at least one of when the corrected calculated value of internal resistance is not less than the internal resistance degradation criterion value and when the corrected calculated value of capacitance is not more than a capacitance degradation criterion value previously stored in the storage.

8. The vehicle power supply device of claim 1, wherein the storage stores the plurality of degradation determination formulas corresponding to the temperatures detected by the temperature sensor.

9. A method for determining degradation of a vehicle power supply device, the method comprising:
measuring a temperature of a capacitor unit including a plurality of capacitors storing auxiliary power;
acquiring an internal resistance value of the capacitor unit;

acquiring a capacitance value of the capacitor unit;

acquiring a corrected calculated value of internal resistance and a corrected calculated value of capacitance by having a microprocessor perform a correction calculation of the internal resistance value and the capacitance value in accordance with the temperature;

acquiring an internal resistance standard value from the corrected calculated value of capacitance using a plurality of different degradation determination formulas corresponding to numerical ranges of the corrected calculated value of capacitance; and determining a degradation level of the capacitor unit based on at least one of the internal resistance standard value and the corrected calculated value of capacitance.

10. The method for determining degradation of a vehicle power supply device of claim 9, further comprising:

at least one of charging and discharging the capacitor unit at a constant current;

detecting a current value of the capacitor unit; and detecting a change, as a voltage value and a voltage change rate, in a voltage change of the capacitor unit before and after a charging or discharging operation is suspended or before and after the charging or discharging operation is resumed in the charge-discharge step when the capacitor unit is charged or discharged, wherein the internal resistance value is acquired based on the voltage value detected in the voltage value detecting step and the current value detected in the current value detecting step; and the capacitance value of the capacitor unit is acquired based on the voltage change rate detected in the voltage value detecting step and the current value detected in the current value detecting step.

11. The method for determining degradation of a vehicle power supply device of claim 9, wherein the capacitor unit is determined to be degraded based on at least one of when the corrected calculated value of internal resistance is not less than the internal resistance degradation criterion value and when the corrected calculated value of capacitance is not more than a capacitance degradation criterion value previously stored in the storage.

* * * * *